United States Patent [19]

Naarmann et al.

[11] 4,395,497
[45] Jul. 26, 1983

[54] PREPARATION OF ELECTRICALLY CONDUCTIVE SOLUBLE HETEROPOLYPHENYLENES

[75] Inventors: Herbert Naarmann, Wattenheim; Dieter Naegele, Worms; Klaus Penzien, Frankenthal; Johannes Schlag, Ludwigshafen, all of Fed. Rep. of Germany

[73] Assignee: BASF Aktiengesellschaft, Fed. Rep. of Germany

[21] Appl. No.: 273,688

[22] Filed: Jun. 15, 1981

[30] Foreign Application Priority Data

Jul. 8, 1980 [DE] Fed. Rep. of Germany ....... 3025771

[51] Int. Cl.³ ............................................. C08L 77/02
[52] U.S. Cl. ................................... 523/135; 252/500; 252/512; 252/518; 523/135; 523/137; 524/156; 524/259; 524/287; 524/349; 524/404; 524/408; 524/410; 524/415; 524/429; 524/439; 524/606; 528/331
[58] Field of Search ................ 528/331; 524/606, 156, 524/259, 287, 349, 404, 410, 408, 415, 429, 439; 523/135, 137; 252/500, 512, 518

[56] References Cited

U.S. PATENT DOCUMENTS 4,208,505  6/1980  Groult et al. ....................... 528/331

*Primary Examiner*—Harold D. Anderson
*Attorney, Agent, or Firm*—Keil & Whiterspoon

[57] ABSTRACT

A process for the preparation of electrically conductive heteropolyphenylenes, wherein from 0.5 to 5 per cent by weight of an activating additive is introduced, in the absence of moisture and of oxygen, into a heteropolyphenylene of the general formula

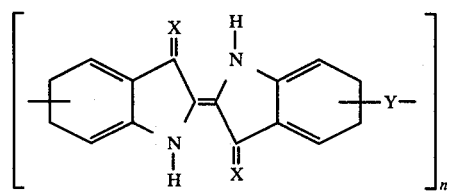

where X is O, S, Se, SO or $SO_2$ and Y has one of the meanings given for X or is NH, $CH_2$, CO or $C_6H_4$, and n is from 2 to 250. The activating additive is preferably one of the compounds $AsF_5$, $SbF_5$, $UF_6$, $HClO_4$, $NO^+SbF_6^-$, $NO_2^+SbF_6^-$, $NO^+PF_6^-$, $SbCl_5$, $NO_2^+PF_6^-$, $NO^+BF_4^-$, $NO^+ClO_4^-$, $(CF_3)_2SO_4$, 2,4,6-trinitrophenol, 2,4,6-trinitrophenylsulfonic acid and 2,4,6-trinitrophenylcarboxylic acid, or is sodium, potassium, rubidium, cesium, calcium or barium or one of their amides, the latter being added, if appropriate, in tetrahydrofuran, dimethoxyglycol, anthracene, naphthalene or 2-methylstyrene. The conductive heteropolyphenylenes may be used in the electrical industry for the production of solar cells, for conversion and fixing of radiation and for the production of electrical and magnetic switches, or may be used for the antistatic treatment of plastics.

7 Claims, No Drawings

PREPARATION OF ELECTRICALLY CONDUCTIVE SOLUBLE HETEROPOLYPHENYLENES

The present invention relates to a process for the preparation of electrically conductive soluble heteropolyphenylenes having conductivities greater than $10^{-2}$ S/cm. The symbol S stands for Siemens. The expression S/cm or Siemens/cm is widely used as a unit of electrical conductivity and is equivalent to $\text{ohm}^{-1}\,\text{cm}^{-1}$.

The preparation of polyphenylenes by oxidative coupling is described in Macromolecular Syntheses Collective, 1 (1979), 109–110 (published by John Wiley & Sons), and Naturwissenschaften 56 (1969), 308–313. Further, R. Gehm and W. Kern, Makromol. Chem. 7 (1951), 46–61, have described the preparation of polyphenylenes by stepwise polycondensation, which gives particularly uniform, para-linked methyl-substituted derivatives, which are not contaminated by ortho- or meta-linked polymers.

The work of J. K. Stille, Makromol. Chem. 154 (1972), 49 disclosed the possibility of preparing heteropolyphenylenes by a Diels-Alder condensation.

It is an object of the present invention to provide soluble heteropolyphenylenes and to convert these, by activating additives, into electrically conductive polymers having conductivities greater than $10^{-2}$ S/cm.

We have found that this object is achieved, according to the invention, by a method wherein from 0.5 to 5 percent by weight, based on heteropolyphenylene employed, of an activating additive is introduced, in the absence of moisture and of oxygen, into a heteropolyphenylene of the general formula (I)

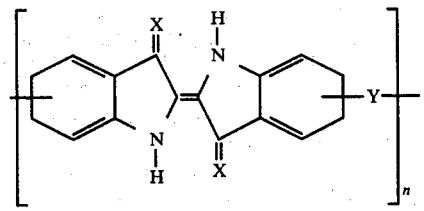

where X is O, S, Se, SO oder $SO_2$, Y has one of the meanings given for X or is NH, $CH_2$, CO oder $C_6H_4$ and n is from 2 to 250, preferably from 5 to 50.

Preferably, the activating additive is a strong Lewis acid having a $pK_a$ of from 10 to 14. Particularly preferably, the Lewis acid used is $AsF_5$, $SbF_5$, $UF_6$, $HClO_4$, $NO^+SbF_6^-$, $NO_2^+SbF_6^-$, $NO^+AsF_6^-$, $SbCl_5$, $NO_2^+PF_6^-$, $NO_2^+AsF_6^-$, $NO^+PF_6^-$, $NO^+BF_4^-$, $(CF_3)_2SO_4$, $NO^+ClO_4$, 2,4,6-trinitrophenol, 2,4,6-trinitrophenylsulfonic acid, or 2,4,6-trinitrobenzoic acid. In another preferred method, the activating additive is sodium, potassium, rubidium, cesium, calcium or barium or an amide thereof. Preferably, when using the alkali metals or alkaline earth metals or their amides, an auxiliary fluid such as tetrahydrofuran, dimethoxyglycol, anthracene, naphthalene or 2-methylstyrene is added, in each case in a molar ratio of the former component to the latter component of from 1:1 to 1:3, preferably from 1:2 to 1:3.

To prepare the heteropolyphenylenes (I), difunctional compounds, for example diaminoisophthalic acid (II), are used as starting materials, and are subjected to a reaction similar to a conventional indigo synthesis. (cf. H. R. Christen, Lehrbuch der organ. Chemie, (1970), 710, Sauerländer Verlag, Aarau)

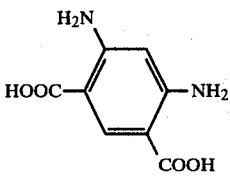

In the soluble heteropolyphenylenes of the general formula (I),

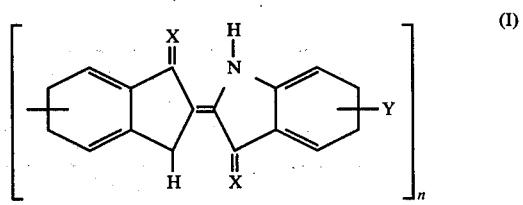

n is from 2 to 250, preferably from 5 to 50, X is O, S, Se, SO or $SO_2$ and Y is X or is NH, $CH_2$, CO or $C_6H_4$.

The additives are always incorporated in the absence of moisture (water) and of oxygen (air); the process is therefore preferably carried out under an argon atmosphere. The solvents which may be used are stripped off, after the incorporation process, under reduced pressure at below 30° C.

By means of the additives mentioned it is possible to achieve increases of several orders of magnitude in the electrical conductivity. The initial conductivities of the polyaromatics are about $10^{-13}$ S/cm, but after introducing the additives according to the invention the conductivities are greater than $10^{-2}$ S/cm.

The electrically conductive heteropolyphenylenes prepared according to the invention and having electrical conductivities greater than $10^{-2}$ S/cm may be used for the antistatic treatment of plastics, for the production of solar cells, for conversion and fixing of radiation and for the production of electrical and magnetic switches. The addition of the strong Lewis acid to the polyaromatic produces an n-conductor, whilst the addition of the aklali metal or alkaline earth metal or of amides thereof produces p-conductors.

In the Examples which follow, parts are parts by weight, and the amounts of additives are expressed in mole percent.

EXAMPLES 10 parts of a heteropolyphenylene (I) are mixed with the relevant additive under an argon atmosphere, in the absence of moisture. The electrical conductivity is measured by the method of F. Beck, Ber. Bunsengesellschaft, Phys. Chem. 68 (1964), 558–567.

The heteropolyphenylene used is of the following type (I)

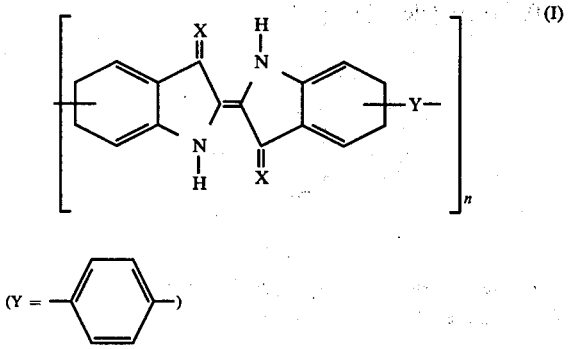

| No. | Polyaromatic type and amount | Doping agent type and amount in mole % | Conductivity in S/cm at 30° C. before doping | after doping |
|---|---|---|---|---|
| 1 | I 1 part n = about 10 x = O | AsF$_5$ 0.2 | $10^{-13}$ | $0.5 \times 10^{-2}$ |
| 2 | I 1 part n = about 15 x = O | SbF$_5$ 0.4 | " | $0.9 \times 10^{-2}$ |
| 3 | I 1 part n = about 15 x = S | BF$_3$ 0.5 | " | $1.5 \times 10^{-3}$ |
| 4 | I 1 part n = about 35 x = S | NO$_2$+SbF$_6$ 0.2 | $10^{-11}$ | $7.0 \times 10^{+1}$ |
| 5 | I 1 part n = about 15 x = S | NO+SbF$_6$ 0.2 | $10^{-12}$ | $2.6 \times 10^{+1}$ |
| 6 | I 1 part n = about 20 x = Se | CF$_3$SO$_3$H 0.2 | " | $0.4 \times 10^{+1}$ |
| 7 | I 1 part n = about 10 x = O | Na 0.5 | $10^{-13}$ | $0.5 \times 10^{-1}$ |
| 8 | I 1 part n = about 20 x = O | AsF$_5$ 0.2 | about $10^{-13}$ | $0.5 \times 10^{-1}$ |
| 9 | I 1 part n = about 25 x = O | AsF$_5$ 0.2 | " | $1.6 \times 10^{-2}$ |
| 10 | I 1 part n = about 35 x = O | AsF$_5$ 0.2 | " | $2.3 \times 10^{-1}$ |
| 11 | I 1 part n = about 50 x = O | AsF$_5$ 0.2 | " | $3.5 \times 10^{+1}$ |
| 12 | I 1 part n = about 20 x = S | AsF$_5$ 0.2 | " | $4.6 \times 10^{-1}$ |
| 13 | I 1 part n = about 80 | SbF$_5$ 0.2 | about $10^{-12}$ | $9.4 \times 10^{+1}$ |
| 14 | I 1 part n = about 35 x = Se | AsF$_5$ 0.2 | about $10^{-11}$ | $0.6 \times 10^{+1}$ |
| 15 | I 1 part n = about 20 x = O | H$_2$SO$_4$ 0.3 | about $10^{-13}$ | $1.5 \times 10^{-2}$ |

We claim:

1. A process for the preparation of an electrically conductive heteropolyphenylene having a conductivity greater than $10^{-2}$ S/cm, wherein from 0.5 to 5 percent by weight, based on heteropolyphenylene employed, of an activating additive is introduced, in the absence of moisture and of oxygen, into a heteropolyphenylene of the formula

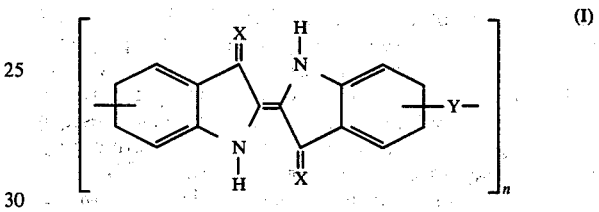

where X is O, S or Se, Y has one of the meanings given for X or is SO, SO$_2$ NH, CH$_2$, CO or phenylene and n is from 2 to 250.

2. A process as claimed in claim 1, wherein the activating additive is a strong Lewis acid, having a pK$_a$ of from 10 to 14.

3. A process as claimed in claim 1 or 2, wherein the Lewis acid is AsF$_5$, SbF$_5$, UF$_6$, HClO$_4$, NO+SbF$_6$−, NO+AsF$_6$−, NO$_2$AsF$_6$−, NO$_2$+SbF$_6$−, NO+PF$_6$−, SbCl$_5$, NO$_2$+PF$_6$−, NO+BF$_4$−, NO+ClO$_4$−, (CF$_3$)$_2$SO$_4$, 2,4,6-trinitrophenol, 2,4,6-trinitrophenylsulfonic acid or 2,4,6-trinitrobenzoic acid.

4. A process as claimed in claim 1, wherein sodium, potassium, rubidium, cesium, calcium or barium or an amide thereof is introduced, as an activating additive, into the heteropolyphenylene (I).

5. A process as claimed in claim 1 or 4, wherein Na, K, Rb, Cs, Ca or Ba or an amide thereof is added in tetrahydrofuran, dimethoxyglycol, anthracene, naphthalene or 2-methylstyrene, in each case in a molar ratio of the former component to the latter component of from 1:1 to 1:5.

6. A process as claimed in claim 1, wherein n is from 5 to 50.

7. A process as claimed in claim 5, wherein the molar ratio of the former component to the latter component is from 1:2 to 1:3.

* * * * *